(12) United States Patent
Beach et al.

(10) Patent No.: US 8,981,503 B2
(45) Date of Patent: Mar. 17, 2015

(54) STT-MRAM REFERENCE LAYER HAVING SUBSTANTIALLY REDUCED STRAY FIELD AND CONSISTING OF A SINGLE MAGNETIC DOMAIN

(75) Inventors: Robert Beach, Los Gatos, CA (US); Guenole Jan, San Jose, CA (US); Yu-Jen Wang, San Jose, CA (US); Witold Kula, Sunnyvale, CA (US); Po-Kang Wang, Los Altos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 442 days.

(21) Appl. No.: 13/421,963

(22) Filed: Mar. 16, 2012

(65) Prior Publication Data

US 2013/0240963 A1 Sep. 19, 2013

(51) Int. Cl.
*H01L 43/08* (2006.01)
*G11C 11/16* (2006.01)

(52) U.S. Cl.
CPC .............. *H01L 43/08* (2013.01); *G11C 11/161* (2013.01)
USPC ............ 257/421; 257/E43.004; 257/E43.006; 365/158; 365/171; 365/173

(58) Field of Classification Search
CPC ......... H01L 43/08; H01L 43/10; H01L 43/12; G11C 11/14–11/16; G11C 11/161
USPC ........... 257/421, E43.004, E43.006; 365/158, 365/171, 173
See application file for complete search history.

(56) References Cited

U.S. PATENT DOCUMENTS

| 5,465,185 | A | 11/1995 | Heim et al. |
| 5,695,864 | A | 12/1997 | Slonczewski |
| 6,221,172 | B1 * | 4/2001 | Saito et al. ................ 148/108 |
| 7,230,844 | B2 | 6/2007 | Deak |
| 7,535,683 | B2 * | 5/2009 | Meguro et al. ........... 360/324.12 |
| 7,592,189 | B2 | 9/2009 | Iwata et al. |
| 7,869,265 | B2 * | 1/2011 | Shimizu et al. ............... 365/158 |
| 7,939,188 | B2 | 5/2011 | Xi et al. |
| 8,531,875 | B2 * | 9/2013 | Yanagi et al. ................ 365/158 |
| 2002/0146887 | A1 | 10/2002 | Liu et al. |
| 2002/0167059 | A1 * | 11/2002 | Nishimura et al. ........... 257/421 |
| 2007/0187785 | A1 | 8/2007 | Hung et al. |
| 2010/0290281 | A1 | 11/2010 | Kim et al. |
| 2011/0235217 | A1 | 9/2011 | Chen et al. |

FOREIGN PATENT DOCUMENTS

WO WO 2011036753 A1 * 3/2011

OTHER PUBLICATIONS

"Systematic Variation of the Strength and Oscillation Period of Indirect Magnetic Exchange Coupling through the 3d, 4d, and 5d Transition Metals," by S. S. P. Parkin, Physical Review Letters, vol. 67, No. 25, Dec. 16, 1991, 1991 The American Physical Society, pp. 3598-3601.

"Domain structure and magnetization reversal of antiferromagnetically coupled perpendicular anisotropy films," by Olav Hellwig, et al., Journal of Magnetism and Magnetic Materials 319 (2007) 13-55, Elsevier, Received Mar. 16, 2007, ScienceDirect.

* cited by examiner

*Primary Examiner* — Allison P Bernstein
(74) *Attorney, Agent, or Firm* — Saile Ackerman LLC; Stephen B. Ackerman (57) ABSTRACT

An STT MTJ cell is formed with a magnetic anisotropy of its free and reference layers that is perpendicular to their planes of formation. The reference layer of the cell is an SAF multilayered structure with a single magnetic domain to enhance the bi-stability of the magnetoresistive states of the cell. The free layer of the cell is etched back laterally from the reference layer, so that the fringing stray field of the reference layer is no more than 15% of the coercivity of the free layer and has minimal effect on the free layer.

20 Claims, 5 Drawing Sheets

STT-MRAM REFERENCE LAYER HAVING SUBSTANTIALLY REDUCED STRAY FIELD AND CONSISTING OF A SINGLE MAGNETIC DOMAIN

TECHNICAL FIELD

This application relates generally to a spin torque transfer magnetic random access memory (STT-MRAM) cell formed using a magnetic tunneling junction (MTJ) as the basic memory element, wherein a ferromagnetic free layer has a perpendicular magnetic anisotropy (PMA).

BACKGROUND

The conventional magnetic tunneling junction (MTJ) device is a form of ultra-high magnetoresistive device in which the relative orientation of the magnetic moments of parallel, vertically separated, upper and lower magnetized layers controls the flow of spin-polarized electrons tunneling through a very thin dielectric layer (the tunneling barrier layer) formed between those layers. When injected electrons pass through the upper layer they are spin polarized by interaction with the magnetic moment of that layer. The majority of the electrons emerge polarized in the direction of the magnetic moment of the upper layer, the minority being polarized opposite to that direction. The probability of such a polarized electron then tunneling through the intervening tunneling barrier layer into the lower layer then depends on the availability of states within the lower layer that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of bi-state resistor, since different relative orientations (e.g. parallel and antiparallel) of the magnetic moments will change the magnitude of a current passing through the device. In a common type of device configuration (spin filter), one of the magnetic layers has its magnetic moment fixed in direction (the reference layer), while the other magnetic layer has its magnetic moment free to move (the free layer). The magnetic moment of the free layer is then made to switch its direction from being parallel to that of the reference layer, whereupon the tunneling current is large, to being antiparallel to the pinned layer, whereupon the tunneling current is small. Thus, the device is effectively a two-state, or bi-stable resistor. The switching of the free layer moment direction (writing) is accomplished by external magnetic fields that are the result of currents passing through conducting lines adjacent to the cell. Once the cell has been written upon, the circuitry must be able to detect whether the cell is in its high or low resistance state, which is called the "read" process.

The use of magnetic fields externally generated by current carrying lines to switch the magnetic moment directions becomes problematic as the size of the MRAM cells decreases and, along with their decrease, so must the width of the current carrying lines. The smaller width lines require greater currents to produce the necessary switching fields, greatly increasing power consumption.

For this reason, a new type of magnetic device, called a spin torque transfer (STT) device, described by Slonczewski, (U.S. Pat. No. 5,695,164) has been developed, that seems to eliminate some of the problems associated with the excessive power consumption necessitated by the need for external switching fields. The spin transfer device shares some of the operational features of the conventional MTJ cell (particularly the read process) described above, except that the switching of the free layer magnetic moment (the write process) is produced internally by passage of the spin polarized current itself. In this device, unpolarized conduction electrons passing through the reference layer, whose magnetic moment is oriented in a given direction, are preferentially polarized by their passage through that layer by a quantum mechanical exchange interaction with the polarized bound electrons in the layer. Such a polarization can occur to conduction electrons that reflect from the surface of the magnetized layer as well as to those that pass through it. The efficiency of such a polarization process depends upon the crystalline structure of the layer. When such a stream of polarized conduction electrons subsequently pass through the free magnetic layer, whose polarization direction is not fixed in space, the now polarized conduction electrons exert a torque on the bound electrons in the free layer which, if sufficient, can reverse the polarization of the bound electrons and, thereby, reverse the magnetic moment of the free layer. The complete physical explanation of such a torque-induced reversal is complicated and depends upon induction of spin precession and certain magnetic damping effects (Gilbert damping) within the magnetic layer. That explanation will not be given herein. The use of a current internal to the cell to cause the magnetic moment reversal requires much smaller currents than those required to produce an external magnetic field from adjacent current carrying lines to produce the moment switching.

The equilibrium magnetic moments of the free and reference layers (i.e. when the conduction current is not passing through them) can lie either in the deposition plane of the magnetic layers or perpendicularly to that plane. Perpendicular magnetization is accomplished by engineering a perpendicular magnetic anisotropy (PMA) into the layer stack, within either the bulk of the layer material or at the interfaces of the layers. The present disclosure is directed at this PMA configuration.

Figure 1:
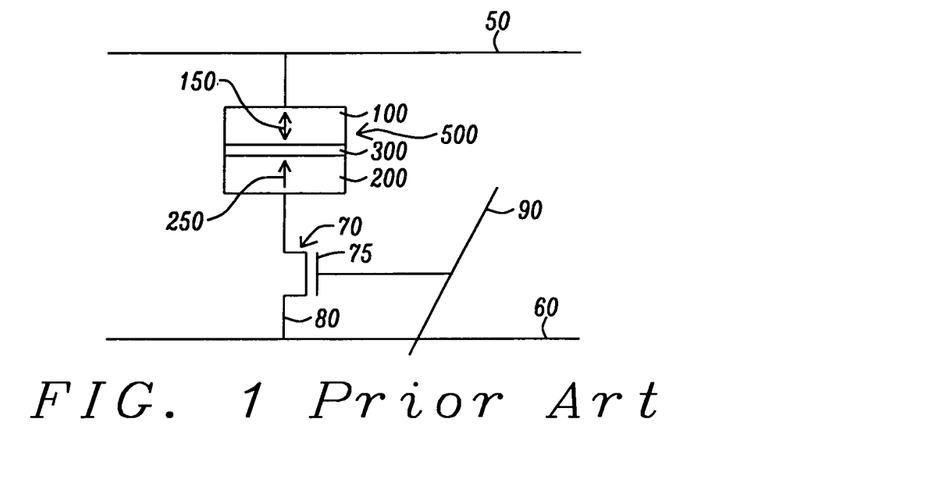
FIG. 1 is a schematic representation of a STT MTJ cell, in a PMA configuration, connected between bit lines and accessed by a write line.

Referring first to FIG. 1, there is shown a highly schematic diagram indicating how a typical, single STT MTJ cell, in the PMA configuration, is connected within a circuit that would typically contain a multiplicity of such cells. The cell (500) is shown as a three-layer fabrication, having a free layer (100), a reference layer (200) and a tunneling barrier layer (300) positioned between them. In accord with their PMA configuration, the free layer (100) is shown with a double ended arrow (150), indicating the two perpendicular directions that its magnetic moment will take under the action of a passing current. The reference layer is shown with a single ended arrow (250) to indicate its fixed perpendicular magnetic moment.

The cell (500) is positioned between two current carrying lines, a bit line (50), and a complementary bit line (60). An accessing transistor (70) is shown in the connecting line (80) between the complementary bit line (60) and the reference layer (200) of the cell. The gate electrode (75) of the transistor is connected to another current carrying line (90), called the write line. When a current in the write line activates the gate electrode (75), the transistor allows a current to pass through the cell between the bit line (50) and the complementary bit line (60), typically causing a flip of the direction of the magnetic moment (150) of the free layer, which is termed a write operation.

In general, the reference layer (200) exerts a magnetic field (denoted a "stray field") on the free layer (100). This field is a result of magnetic charges (i.e. the divergence of the magnetization vector) on the opposite surfaces of the reference layer. This field usually favors magnetic alignment of the magnetization vectors, (150) and (250) of the two layers. The orientation of the magnetic moment of the free layer (relative to that of the reference layer) corresponds to the storage of a bit of information. Whether this bit is a "0", corresponding to alignment and minimum resistance, or a "1" corresponding to anti-alignment and a maximum resistance, can be determined by a measurement of the current passing through the cell. To guarantee that the bit, once written, remains stable until it is overwritten, it is desirable that the free layer magnetic moment should not be influenced by the magnetic field of the reference layer. Therefore, the reference layer should be designed to exert a minimal field on the free layer, with an "ideal" design producing a zero field at the position of the free layer.

As an approach to minimization of the field of the reference layer, Heim et al. (U.S. Pat. No. 5,465,185), teach a reference layer formed as a synthetic antiferromagnetic structure (SAF).

Figure 2:
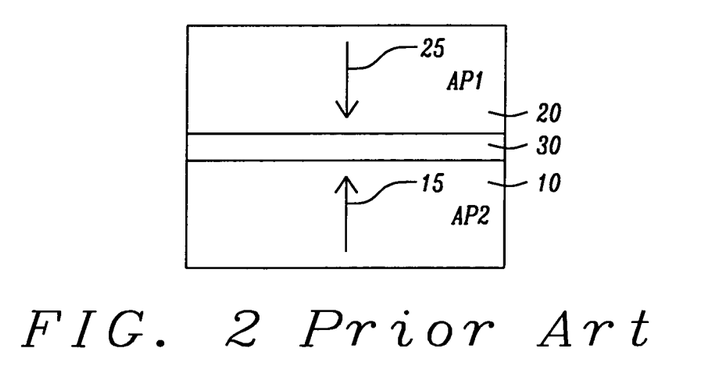
FIG. 2 is a schematic cross-sectional view of a typical SAF layer, in this case a reference layer.

Referring to FIG. 2, there is shown a highly schematic illustration of an SAF reference layer. The SAF structure is a three layer structure: (AP2)/non-magnetic/(AP1), where AP2 (10) and AP1 (20) are ferromagnetic layers, coupled, at equilibrium, in a mutually anti-parallel configuration of their magnetic moments (arrows (15) and (25)) across a non-magnetic coupling layer (30) that is typically a thin layer of ruthenium (0.9 nm). The reduced net magnetic moment of the coupled pair lessens the magnitude of the stray field acting on the free layer.

Figure 3:
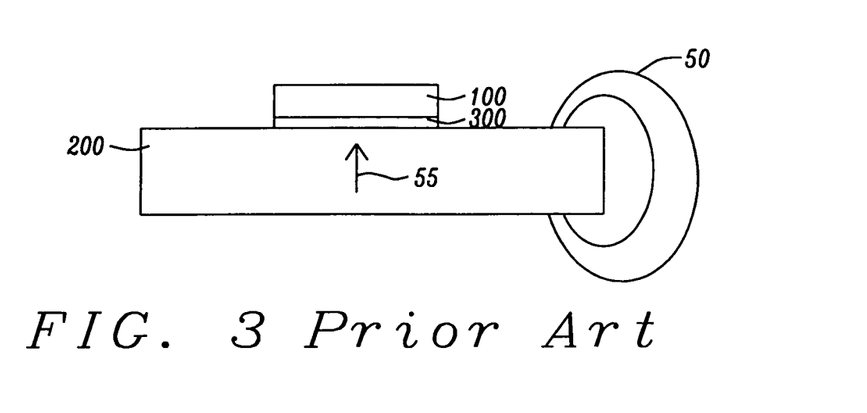
FIG. 3 is a schematic cross-sectional view of a "partially etched" MTJ design, in which the free layer is etched back laterally from the reference layer to avoid the effects of its stray fields.

Another mechanism of minimizing the reference layer field is taught by Xi (US Patent Publication No. 2010/0102406). In this approach, which has been denoted a "partial etch" design, as illustrated schematically in FIG. 3, the free layer (100) and barrier layer (300) are partially etched back so that the free layer specifically is substantially narrower than the reference layer (200). The fringing field (50) of the magnetization (55) of the reference layer (200), which is primarily due to magnetic charges creating a dipole configuration at the lateral edges of the reference layer, is substantially removed from the free layer, so that its effects on the free layer are minimized. When the width of the reference layer approaches "infinity" (i.e. is very much wider than the free layer), the magnetic charges on its top and bottom surfaces would effectively cancel and produce a stray field of essentially zero magnitude. When the width of the reference layer is large, but finite, as in FIG. 3, the stray field is not reduced to zero, but its sources are the unbalanced upper and lower surface charges at the opposite lateral edges of the layer (as shown in the figure), much like the fringing electric field produced at the edges of a parallel plate capacitor. However, the partial etch design still does not alleviate the problems of the reference layer fields because even the stray field at the edges of a 500 nm diameter "simple" (not composite) reference layer is appreciable, the magnitude of H being: H>25 Oe.

SUMMARY

It is the first object of the present disclosure to provide a STT MTJ cell design having a PMA configuration that substantially reduces the effects of the reference layer stray field on the free layer.

It is the second object of the present disclosure to provide an STT MTJ cell having well defined and reproducible bi-stable resistance states.

These objects will be met by employing an approach that combines certain elements of the SAF reference layer structure with elements of the partial etch design. An important feature of the SAF reference layer structure is that it minimizes stray fields by means of an anti-parallel configuration of magnetic moments within a composite reference layer. An important feature of the partial etch design is that it minimizes stray fields by moving their sources to the opposite lateral edges of a reference layer that is substantially wider than the free layer. Thus there is a combination of advantageous magnetic properties (the net magnetic moment reduction of an SAF configuration) and geometric properties (the differences in width of the free and reference layers) that act in concert to significantly reduce or completely eliminate the effects of the stray field.

Figure 4:
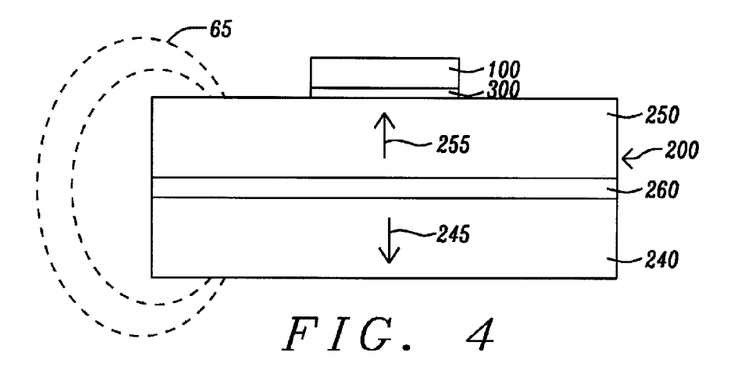
FIG. 4 is a schematic, side cross-sectional view of a STT MTJ cell design that meets the objects of the present disclosure.

Referring to FIG. 4, there is shown a highly schematic illustration of a cell design that meets the objects of this disclosure. There is shown a free layer (100) a reference layer (200) and a tunneling barrier layer (300). The free layer (100) is partially etched back laterally relative to the reference layer (200), thereby having a substantially narrower width. The reference layer is formed in a SAF configuration, including layers AP2 (240), AP1 (250) and a non-magnetic coupling layer (260), across which the layers AP2 and AP1 are magnetically coupled with their magnetization vectors (255) and (245) oppositely directed (i.e., in an anti-parallel configuration). Note that only a weak fringing field (65) is shown, in contrast to the stronger fringing field (50) shown in FIG. 3, because the net magnetic moment of the two antiparallel magnetization vectors (255) and (245) is substantially zero and provide virtually no source for the field at the edges of the structure.

Figure 5A:
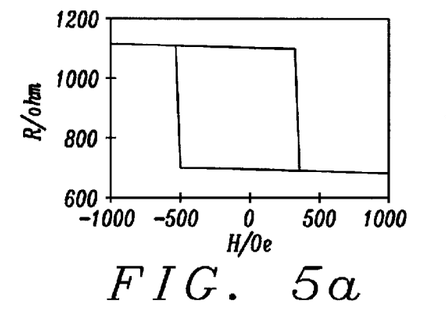
FIG. 5a and FIG. 5b are graphs showing characteristic resistance vs. magnetization plots for MTJ cells having single (a) and multiple (b) domain structures.
Figure 5B:
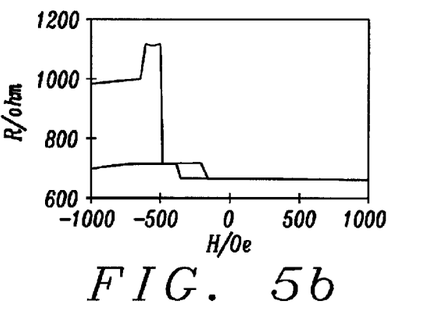

In order for such a device design to operate properly, it is necessary that the reference layer exhibit sufficient perpendicular magnetic anisotropy (PMA) for the magnetic moments of the layer to align perpendicular to the film plane. Furthermore, it is essential for the reference layer to consist of a single magnetic domain in order to insure a clean, bi-stable magnetoresistive response (i.e., to insure that high and low resistance values of the cell are sharply defined and reproducible). A typical diameter of the reference layer is between 100 and 400 nm. The size of thin-film magnetic domains is typically smaller than this diameter, so the reference layer will typically contain multiple domains. The walls separating these domains can move in and out beneath the free layer during device operation, causing undesirable variations in the magnetoresistance of the cell. Referring to FIGS. 5a and 5b, there are shown two pictorial graphs illustrating the variations of the magnetoresistance, R, of a cell with layer magnetization, H.

FIG. 5a corresponds to a cell whose reference layer has a single magnetic domain. As can be seen, the shift in magnetoresistance, R, is sharp and well defined as the magnetic moment of the free layer changes its direction with respect to the reference layer from anti-parallel (negative H) to parallel (positive H). This is a highly desirable bi-stable response.

In FIG. 5b, however, there are multiple domains and corresponding movement of the domain walls, producing an erratic response of the magnetoresistance, R, with the change in relative direction of the magnetizations. This is an undesirable response.

DETAILED DESCRIPTION

The present disclosure is an STT (spin torque transfer) MTJ (magnetic tunneling junction) cell operating in a PMA (perpendicular magnetic anisotropy) mode. In order to minimize the effects of the magnetic field of the reference layer on the magnetization of the free layer, the reference layer is formed as a SAF (synthetic antiferromagnetic) structure and the free layer is partially etched back laterally so that its width is substantially less than the width of the reference layer. The stray field of the reference layer should, therefore, be sufficiently small at the free layer position, typically less than 15% of the coercivity of the free layer. Furthermore, the reference layer of the cell should have a single magnetic domain structure in order for the cell to exhibit a well defined bistable response.

Referring once again to FIG. 4, there is shown the basic structure of the present cell, showing, in side cross-section, a free layer (100) a SAF reference layer (200) and a tunneling barrier layer (300). The free layer (100) is partially etched back laterally relative to the reference layer (200), thereby having a substantially narrower width and satisfying the condition that the stray field of the reference layer (65), which emanates from its lateral edges, should be less than 15% of the coercivity of the free layer.

In STT-MRAM structures (comprising cells of the type described herein), free layer diameters of interest are between 20 and 100 nm. On the other hand, the diameter of the reference layer must be smaller than the distance between bits (i.e. individual cells) in the MRAM array. This distance, or "pitch" of the array, will be less than 500 nm. Therefore, we will be interested in in cells having reference layers with diameters between 50 nm and 500 nm and free layers having substantially smaller diameters, between 20 nm and 100 nm. The width (i.e., diameter) of the reference layer should exceed the width of the free layer by a factor of between 1.5 and 10.

Figure 6:
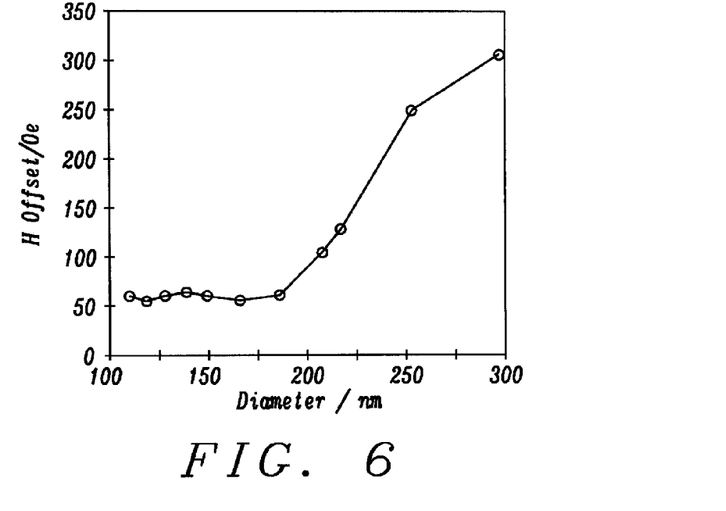
FIG. 6 is a graphical illustration of the offset magnetic fields of a reference layer as a function of its lateral width.

Referring to FIG. 6, there is shown a graphical illustration of the fringing stray field at the position of the free layer, for a reference layer whose diameter is fixed at 300 nm, as the free layer diameter is progressively etched back from 300 nm (the diameter of the reference layer), to approximately 100 nm. As can be seen, the effect of the field of the reference layer on the free layer is progressively diminished until the diameter of the free layer reaches approximately 200 nm, a reference layer to free layer width ratio of 1.5, whereupon the free layer becomes insensitive to any further reductions in its size.

Referring back to FIG. 4, it is shown that along with the proper diameter ratio of free layer to reference layer, the reference layer should also have a SAF structure, consisting of oppositely magnetized (in the perpendicular direction) layers AP1 (250) and AP2 (240). Layer AP1 is proximal (immediately adjacent) to the tunneling barrier layer (300), whereas layer AP2 (240) is distal to the tunneling barrier layer. These two ferromagnetic layers are antiferromagnetically coupled across a thin (0.3 to 1.0 nm) non-magnetic layer (260) of Ru, Ir, Rh or Os, as described by S. S. P. Parkin et al., Phys. Rev. Lett. 67, 3598 (1991), which is fully incorporated herein by reference.

The magnetic easy axis of the reference layer should be perpendicular to the film plane. To create such a PMA condition, AP1 and AP2 should be formed as multilayers of [Co/Pd], [Co/Ni] or [Co/Pt] alloys, or formed as PMA L1$_0$ tetragonal alloys, such as FePd. AP1 and AP2 can be formed as any combination of these and, in addition, they might contain additional layers to enhance or suppress other device attributes, such as magnetoresistance (eg. by a CoFeB dusting on AP1), barrier integrity (eg. by a Ta insertion), or spin-torque efficiency.

In addition to the characteristics of single domain and PMA, it is also desirable and advantageous to minimize the strength of the reference layer stray field at the position of the free layer. The thicknesses and magnetizations of AP1 and AP2 should be adjusted so that the net offset field (the fringing field at the layer edge) from the reference layer is minimal. This will generally require that $M_s t$, the product of saturation magnetization, $M_s$, and thickness, t, for AP1 and AP2 be substantially equal, where $M_s$ represents the average saturation magnetization of the typically inhomogeneous magnetizations of the AP1 and AP2 layers.

We have already stressed the importance of a single domain state for the reference layer so as to eliminate domain wall motions and their adverse effect on magnetoresistive bi-stability. As noted by O. Hellwig et al., in J. Magn. And Mag. Mat., 319 (2007), the SAF reference layer will revert to a multi-domain state if the magnetic moments of either AP1 or AP2 exceed a threshold value. This is a result of the competing energetics (demagnetizing, domain wall and interfacial coupling energies) of the single domain state, for which the AP1 and AP2 sub-layers are anti-aligned, and the multi-domain state, for which the sub-layers are aligned. A single domain, anti-aligned state is desired and preferred.

Figure 7:
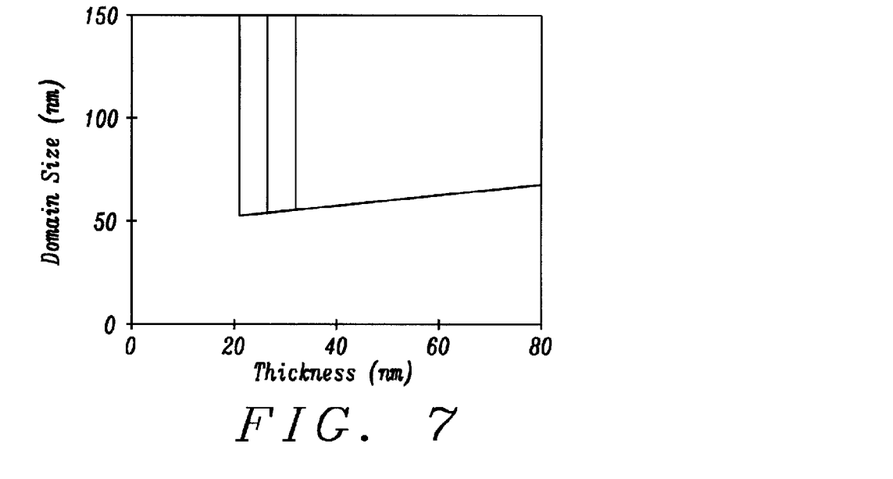
FIG. 7 is a graphical illustration of the variation of magnetic domain size vs. total SAF layer thickness for different interlayer coupling strengths of the AP1 and AP2 layers.

Referring to FIG. 7, there is shown a transition that occurs between a single domain state (of essentially infinite domain size) to a multi-domain state, as the total thickness, t, of the reference layer increases beyond a threshold value. Three interlayer coupling strengths (0.2, 0.5 and 0.8 erg/cm$^2$) are shown and $M_s$=600 emu/cm$^3$. Single-domain behavior is enhanced by making the coupling across the non-magnetic interlayer ((300) in FIG. 4), which is formed of Ru, Ir, Rh, or Os, as strong as possible. To achieve this strong coupling, it is desirable to use a thickness of the coupling layer that corresponds to its first antiferromagnetic RKKY coupling peak. This peak, for a coupling material of Ru, lies at a thickness of 0.4 nm. Due to concerns of materials stability during the processing of such a thin layer of Ru, the more robust second RKKY coupling peak at 0.9 nm for Ru may suffice. In order to strengthen the coupling between AP1 and AP2 still further, a thin dusting of approximately 0.4 nm of Co, may be deposited on each side of the non-magnetic interlayer that faces AP1 and AP2.

Figure 8:
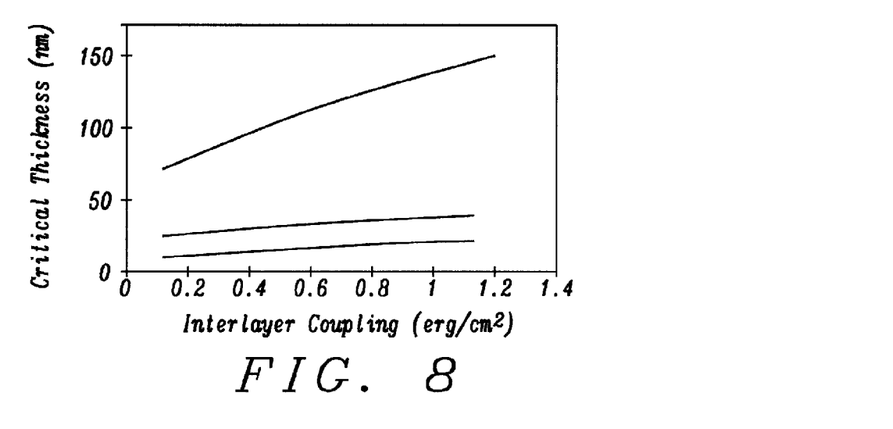
FIG. 8 is a schematic graphical illustration plotting the variation of critical SAF reference layer thickness vs. interlayer coupling strength for values of saturation magnetization, $M_s$=300, 600 and 900 emu/cm$^3$.

Referring next to FIG. 8, there is shown how the threshold thickness for producing single-domain behavior strongly depends of the saturation magnetization, $M_s$, of the sub-layers AP1 and AP2. In the figure, there is plotted the critical reference layer thickness vs. interlayer coupling strength for three values of $M_s$: $M_s$=300, 600 and 900 emu/cm$^3$. For the range of $M_s$ that encompasses all practical values, which may be given as: 200<$M_s$<1200 emu/cm$^3$, universal scaling is observed between the interlayer coupling strength (in erg/cm$^2$) and the product between $M_s^2$ and $t_c$, the critical thickness, ($M_s^2 t_c$) in nm.

Figure 9:
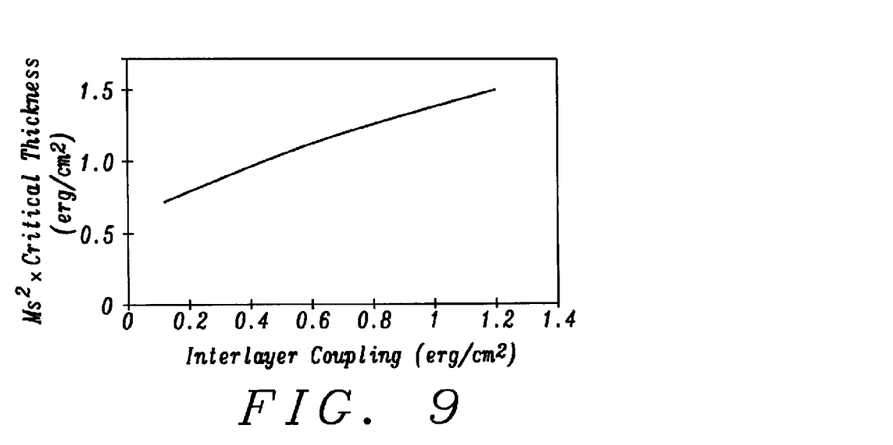
FIG. 9 is a schematic graphical representation showing the universal scaling (merging of the curves) of the variation of the product $M_s^2 t_c$ ($t_c$ being critical thickness) with interlayer coupling strength, for $M_s$=300, 600 and 900 emu/cm$^3$.

Referring now to FIG. 9, there is shown the three curves of $M_s^2 t_c$ vs. interlayer coupling strength, for the values of $M_s$=300, 600 and 900 emu/cm$^3$. The three curves have merged into a single curve, indicating the universal scaling that becomes evident when $M_s^2 t_c$ is plotted vs. interlayer coupling strength. Note that the same three values of $M_s$ produced separated curves in FIG. 8, when $t_c$ was plotted vs. interlayer coupling, showing the lack of universality of that relationship.

We conclude that in order for the reference layer to form a single magnetic domain state, the product $M_s^2 t$ must be reduced below a critical value, $M_s^2 t_c$, which, as shown in FIG. 9, depends on the strength of the interlayer coupling. For Ru, the first antiferromagnetic coupling peak (approx. 0.8 erg/cm$^2$) is observed for a Ru coupling layer of 0.4 nm thickness. The second antiferromagnetic coupling peak (approx. 0.4 erg/cm$^2$) is observed for a Ru coupling layer of 0.9 nm thickness. The $M_s^2 t$ product (where t represents the total thickness of the reference layer and $M_s$ represents the average magnetization of AP1 and AP2) must, therefore, have a value of $M_s^2 t$<1 erg/cm$^2$ in order to ensure that a single domain will be formed.

Figure 10A:
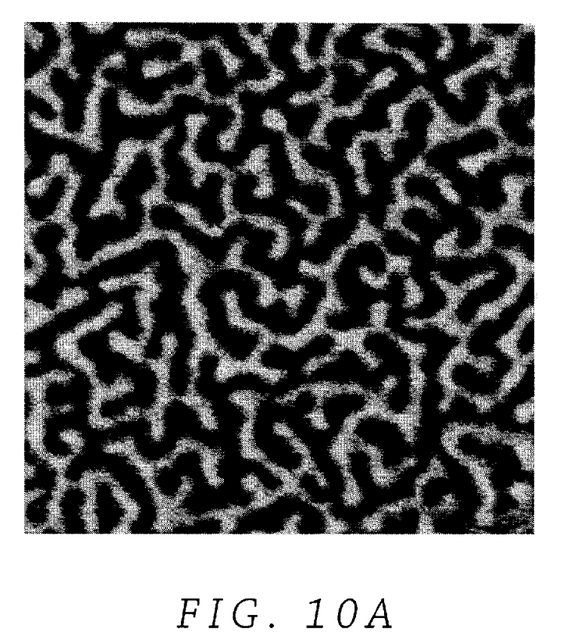
FIGS. 10a and 10b are "full-film" (unpatterned magnetic layers, 10 microns square) MFM images of the domain structures in a "simple" film (a) and a SAF film structure (b), showing that the domain size in (b) exceeds the useful maximum reference layer diameter of 500 nm.
Figure 10B:
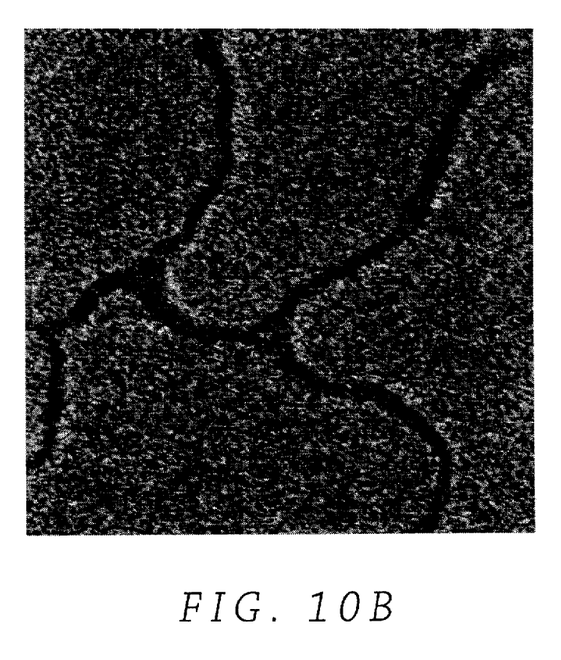

Referring next to FIGS. 10(a) and 10(b), there are shown pictorial representations: (a) of the magnetic domain boundaries of a single layer (non-SAF) reference layer, and (b) the magnetic domain boundaries of a SAF reference layer. The layers are unpatterned squares, 10 microns on a side, and the images are magnetic force microscopy (MFM) images. The simple layer of (a), which is a [Pd/Co]—[NiCo] layer, shows a multi-domain state. The SAF layer of (b), which is a [Ni/Co]/Ru/[Co/Ni] coupled layer, shows what is essentially a single domain state, given that the 10 micron square greatly exceeds the maximum useful reference layer diameter of 500 nm in a realistic MRAM system.

Referring back to FIG. 4, the STT-MTJ cell can be formed so that the wide reference layer (200) is either below the narrow free layer (10) as shown in the figure, or is above the free layer. There are no substantive reasons to imply that the magnetic performance of the cell would be different in the inverted configuration. However, in the inverted configuration, the deposition order of AP1 and AP2 would have to be reversed. It is possible that the added complexity of the inverted design fabrication will be outweighed by the desirability of having the free layer beneath the reference layer for a variety of electrical considerations that will not be discussed herein.

Figure 11:
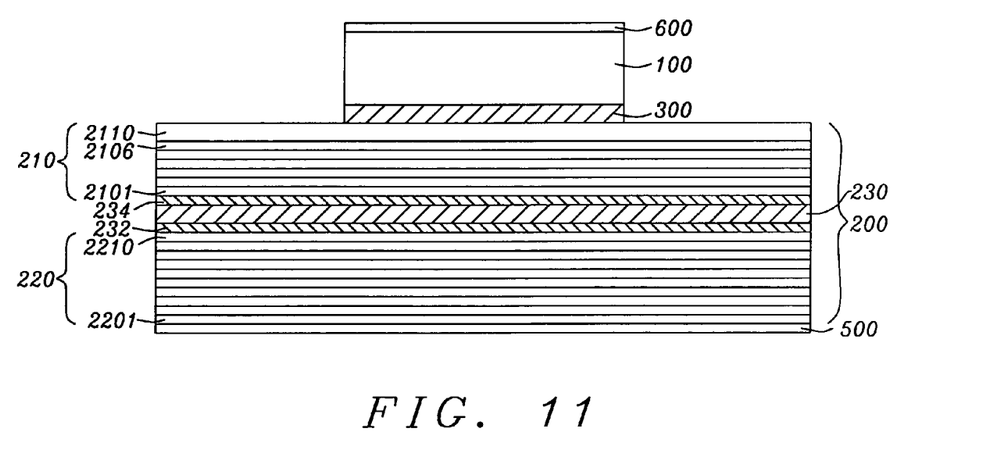
FIG. 11 is a schematic side cross-sectional view of a particular embodiment of a cell that meets the objects of the present disclosure.

A fabrication that will meet all the objects of the STT MTJ cell discussed above, i.e., it will produce a PMA configuration, having a single domain reference layer state for well defined and reproducible bi-stability and a reduced stray field of the reference layer at the position of the free layer, is the following configuration of layers, as illustrated in FIG. 11 and described immediately below.

NiCr/[Ni6A/Co2.5A]10/Co4A/Ru4A/Co4A/[Co2.5A/Ni6A]6/Co2.5A/Ta1.5A/Co FeB6A/Co4/MgO11A/CoFeB14A/Ta20A

Referring to the material formula above and to its illustration in FIG. 11, there is shown a schematic side cross-sectional view of the above fabrication comprising a seed layer (500), a SAF multi-layered reference layer (200), a tunneling barrier layer (300), a free layer (100) and a capping layer (600). The diameter of the reference layer (200) is approximately 7 times that of the free layer to provide the required elimination of stray field effects at the free layer. The free layer (100) is positioned on top of the reference layer, but as previously noted, the order can be reversed.

In this preferred embodiment, AP1 (210) and AP2 (220) are formed as multilayers of [Ni/Co] alloys. The multilayer structure of AP2 consists of 10 identical repeated layers (2201)-(2210) of 6 angstroms of Ni on 2.5 angstroms of Co, written above as [Ni6A/Co2.5A]10.

The multilayer structure of AP1 consists of 6 identical repeated layers (2101)-(2106), written above as [Co2.5A/Ni6A]6. The top dusting of CoFeB6/Co4 makes the net magnetic moment of AP2 slightly greater than that of AP1. Because AP2 is farther from the free layer than AP1, the net stray field acting on the free layer is nearly zero.

AP1 and AP2 are strongly coupled antiferromagnetically by the insertion of a layer (230) of Ru of 0.4 nm thickness, between AP1 and AP2, which produces the first RKKY peak. A dusting (232), (234) with 4 angstroms of Co is provided at the interface between the Ru layer and the interfacially contiguous layers of AP1 and AP2 to increase the coupling strength. The dusted coupling layer is indicated above as Co4A/Ru4A/Co4A.

"A nano-layer of 1.5 angstroms thick Ta provides stability to the tunneling barrier layer and a dusting layer of 6 angstroms of CoFeB and 4 angstroms of Co on top of AP1 enhances the magnetoresistance of the cell. Note that the CoFeB/Co dusting over AP1 enhances the magnetic moment of AP1 and thereby balances the magnetic moments of AP1 and AP2, contributing to the minimization of the stray field of the reference layer. This portion of the structure, Ta1.5A/CoFeB6A/Co4, is indicated above as (2110). Note that when the fabrication is patterned, by a process such as reactive ion etching, to reduce the width of the free layer, layer (2110) retains the width of the reference layer. Care should be taken that the etching of the free layer does not extend into the surface of the reference layer, so actually stopping at the layer (2110) can be thought of as a margin of safety to guide the depth of the etching process. Finally, the actual tunneling barrier layer (300) is 11 angstroms of MgO, the free layer (100) is 14 angstroms of CoFeB and the capping layer (600) is 20 angstroms of Ta. The combination being given as MgO11A/CoFeB14A/Ta20A."

As has been discussed above, after the depositions have been completed, the free layer is etched back to reduce its width relative to the reference layer (the reference layer, in this case, being 7 times the width of the free layer) to eliminate the effects of the fringing field (to less than 15% of the free layer coercivity) from the reference layer on the free layer. Such an etch process is advantageously carried out using reactive ion etching (RIE) or ion beam etching (IBE), or physical etching. It is important to achieve selectivity in the etching process, i.e., variation of the etch rate between the layers to be etched away, the cap and free layer, and the tunnel barrier, on which one wants the etch process to stop.

As is finally understood by a person skilled in the art, the preferred embodiments of the present disclosure are illustrative of the present disclosure rather than limiting of the present disclosure. Revisions and modifications may be made to methods, materials, structures and dimensions employed in forming and providing a STT MTJ cell with perpendicular-to plane magnetic anisotropy and reduced stray field effect of a SAF reference layer on a free layer, while still forming and providing such a cell and its method of formation in accord with the spirit and scope of the present disclosure as defined by the appended claims.

What is claimed is:

1. An STT MTJ cell comprising:
    a seed layer;
    a reference layer formed on said seed layer;
    a tunneling barrier layer formed on said reference layer;
    a free layer formed on said tunneling barrier layer;
    a capping layer formed on said free layer; wherein
    a width of said free layer is less than a width of said reference layer; and
    said reference layer is formed as a synthetic anti-ferro magnetically coupled pair of multi-layers of [Co/Pd], [Co/Ni] or [Co/Pt] alloys, said pair denoted AP1 and AP2 and said pair having perpendicular magnetic anisotropy (PMA), or formed as PMA $L1_0$ tetragonal alloys or comprising PMA $L1_0$ tetragonal alloys and wherein
    said anti-ferromagnetic coupling between said AP1 and AP2 occurs at a first or second RKKY peak by use of a coupling layer of Ru, Ir, Rh or Os, formed at a thickness between approximately 0.4 nm, for a first RKKY peak and approximately 0.9 nm for a second RKKY peak and dusted on both faces by a layer of Co of thickness approximately 4 A to further strengthen said coupling;
    said free layer and said reference layer have a magnetic anisotropy that is oriented perpendicular to their planes of formation; and wherein
    a stray field of said reference layer is substantially limited to a fringing field at its opposite lateral edges, whereby said stray field does not affect the magnetization of said free layer; and wherein
    a single domain state of said reference layer is formed to promote well defined magnetoresistive bi-stability.

2. The cell of claim 1 wherein a lateral width of said reference layer is substantially larger than a lateral width of said free layer, whereby the strength of a stray field of said reference layer is less than approximately 15% of a coercivity of said free layer and whereby said stray field does not affect the magnetization of said free layer.

3. The cell of claim 2 wherein a lateral width of said reference layer is between approximately 50 nm and 500 nm.

4. The cell of claim 2 wherein a lateral width of said free layer is between approximately 20 nm and 100 nm.

5. The cell of claim 2 wherein a lateral width of said reference layer exceeds a lateral width of said free layer by a factor between 1.5 and 10.

6. The cell of claim 1, wherein said magnetically coupled reference layer is a synthetic antiferromagnetic reference layer that is formed as a layer denoted AP1, that is proximal to said free layer, and a layer denoted AP2, that is distal to said free layer and wherein said layers AP1 and AP2 are separated by a non-magnetic coupling layer, across which the magnetizations of said layers AP1 and AP2 are coupled in antiparallel directions that are perpendicular to the layer planes and, thereby, lie along a magnetic easy axis of said layers.

7. The cell of claim 6 wherein the AP1 and AP2 layers are formed as multiple repeated layers of $L1_0$ alloys whose product $M_s t$. of average saturation magnetization and thickness is substantially equal, whereby a net stray field at lateral edges of said reference layer attains a minimum value.

8. The cell of claim 6 wherein a domain state of said magnetically coupled reference layer is a multi-domain state when magnetic moments of said layers AP1 and AP2 are aligned and said magnetic moments, either singly or together, exceed a threshold value.

9. The cell of claim 6 wherein said reference layer is formed in a single domain state wherein said magnetic moments, $M_s$, of AP1 and AP2 are anti-aligned and the products of their individual $M_s t$ are substantially equal.

10. The cell of claim 9 wherein said AP2 layer is formed of 10 identical repeated layers of [Ni6A/Co2.5A] and wherein said AP1 layer is formed of 6 identical repeated layers of [Co2.5A/Ni6A] over which is further formed a CoFeB6A/Co4A top layer to enhance the magnetic moment of AP1 and balance the overall magnetic moments of AP1 and AP2.

11. The cell of claim 10 wherein said AP2 layer thereby has a magnetic moment that exceeds that of said AP1 layer, but wherein the stray field at the position of said free layer is essentially zero.

12. The cell of claim 9 wherein a multilayer comprising Ta1.5A/CoFeB6A/Co4A is formed on said AP1 layer, wherein said Ta1.5A provides stability to a tunneling barrier layer and wherein said CoFeB6A/Co4A further enhances the magnetoresistive response of the cell.

13. The cell of claim 12 wherein said tunneling barrier layer is a layer of MgO of 11 angstroms thickness.

14. The cell of claim 13 wherein said free layer is a layer of CoFeB of approximately 14 angstroms thickness.

15. The cell of claim 1 wherein the order of formation of said cell is inverted, whereby said barrier layer and said free layer are formed beneath said reference layer.

16. The cell of claim 15 wherein said reference layer is a synthetic anti-ferromagnetic layer comprising layers AP1 and AP2 coupled across a non-magnetic coupling layer and wherein said barrier layer is between said free layer and said AP2 layer.

17. A method of forming an STT MTJ cell comprising:
    providing a seed layer;
    forming a reference layer on said seed layer, wherein said reference layer is a magnetically coupled multi-layer of [Co/Pd], [Co/Ni] or [Co/Pt] alloys having perpendicular magnetic anisotropy (PMA)., wherein said coupling is anti-ferromagnetic and occurs at a first or second RKKY peak by use of a coupling layer of either Ru, Ir, Rh or Os, formed at a thickness between 0.3 and 1.0 nm and dusted on both faces by a layer of Co of thickness approximately 4 A;
    forming a tunneling barrier layer on said reference layer;
    forming a free layer on said tunneling barrier layer; wherein,
    said reference layer and said free layer are magnetically anisotropic in a direction perpendicular to the planes of their formation;
    forming a capping layer on said free layer;
    partially etching through said capping and said free layers, said etch to proceed no deeper than the surface of said reference layer, whereby said etch removes symmetric lateral portions of said capping and said free layers thereby reducing the width of said layers relative to the width of said reference layer.

18. The method of claim 17 wherein the fringing field of said reference layer is no more than 15% of a coercivity of said free layer.

19. The method of claim 18 wherein said reference layer is formed as a SAF of two ferromagnetic layers and wherein the magnetic moments of said two ferromagnetic layers are rendered substantially equal to minimize said fringing field.

20. The method of claim 17 wherein a thickness of said reference layer is less than a critical thickness, $t_c$, whereby said reference layer is formed with a single domain state.

\* \* \* \* \*